United States Patent
Okura et al.

(10) Patent No.: US 11,721,848 B2
(45) Date of Patent: Aug. 8, 2023

(54) METHOD FOR INSPECTING SELF-DISCHARGE OF A POWER STORAGE DEVICE, AND METHOD FOR PRODUCING THE POWER STORAGE DEVICE

(71) Applicant: Prime Planet Energy & Solutions, Inc., Tokyo (JP)

(72) Inventors: Toshinori Okura, Toyota (JP); Ruri Tanaka, Toyota (JP)

(73) Assignee: PRIME PLANET ENERGY & SOLUTIONS, INC., Tokyo (JP)

( * ) Notice: Subject to any disclaimer, the term of this patent is extended or adjusted under 35 U.S.C. 154(b) by 11 days.

(21) Appl. No.: 17/541,261

(22) Filed: Dec. 3, 2021

(65) Prior Publication Data
US 2022/0278382 A1 Sep. 1, 2022

(30) Foreign Application Priority Data
Feb. 26, 2021 (JP) .................. 2021-029777

(51) Int. Cl.
*H01M 10/48* (2006.01)
*H02J 7/00* (2006.01)
*H01M 10/0525* (2010.01)
*G01R 31/385* (2019.01)

(52) U.S. Cl.
CPC .......... *H01M 10/48* (2013.01); *G01R 31/386* (2019.01); *G01R 31/3865* (2019.01); *H01M 10/0525* (2013.01); *H02J 7/0048* (2020.01)

(58) Field of Classification Search
None
See application file for complete search history.

(56) References Cited

U.S. PATENT DOCUMENTS

| | | | |
|---|---|---|---|
| 2016/0161564 A1* | 6/2016 | Kurihara | H01M 10/42 324/426 |
| 2019/0011502 A1 | 1/2019 | Kobayashi et al. | |
| 2019/0198942 A1 | 6/2019 | Kobayashi et al. | |

FOREIGN PATENT DOCUMENTS

| | | |
|---|---|---|
| JP | 201916558 A | 1/2019 |
| JP | 2019113450 A | 7/2019 |

* cited by examiner

*Primary Examiner* — Jas A Sanghera
(74) *Attorney, Agent, or Firm* — Hauptman Ham, LLP

(57) ABSTRACT

A self-discharge inspection method for a power storage device having a property that while the power storage device is pressed under a first load and charged with a first device voltage, in which a device voltage decreases when a load is reduced from the first load, includes detecting the first device voltage of the power storage device pressed under the first load and charged, continuously applying a power-supply voltage equal to the first device voltage from an external power supply, detecting a power-supply current flowing to the power storage device, determining a self-discharge state of the power storage device based on the detected power-supply current, and reducing the load applied to the power storage device from the first load by a load reduction amount before the power-supply current stabilizes after start of the voltage continuously applying.

6 Claims, 7 Drawing Sheets

METHOD FOR INSPECTING SELF-DISCHARGE OF A POWER STORAGE DEVICE, AND METHOD FOR PRODUCING THE POWER STORAGE DEVICE

CROSS-REFERENCE TO RELATED APPLICATIONS

This application is based upon and claims the benefit of priority to Japanese Patent Application No. 2021-029777 filed on Feb. 26, 2021, the entire contents of which are incorporated herein by reference.

BACKGROUND

Technical Field

The present disclosure relates to a method for inspecting self-discharge of a power storage device to determine a self-discharge state of the power storage device, and, a method for producing the power storage device including this self-discharge inspection method.

Related Art

In the process of producing a power storage device such as a lithium-ion secondary battery, metal foreign substances such as iron or copper may be mixed inside an electrode body or the like. Such mixed metal foreign substances may cause an internal short circuit in the power storage device, leading to self-discharge. Therefore, in the production process of the power storage device, there may be desired to determine the state of self-discharge, e.g., whether the internal short circuit exists in the power storage device and what magnitude of a self-discharge current flows.

As this method for inspecting the self-discharge of the power storage device, for example, the following methods have been known. Specifically, a pre-detection device voltage of a previously-charged power storage device is measured, and a power-supply voltage equal to the pre-detection device voltage is continuously applied from an external power supply to the power storage device. Then, the power-supply current flowing from the external power supply to the power storage device gradually increases from 0 and stabilizes at a magnitude equal to the self-discharge current of the power storage device. Accordingly, this power-supply current is detected, and whether the self-discharge current of the power storage device is larger or smaller than a threshold value is determined based on this detected power-supply current. A related conventional method is disclosed in for example Japanese unexamined patent application publication No. 2019-16558 (JP 2019-16558 A) (see claims thereof).

SUMMARY

Technical Problems

However, even the above-mentioned self-discharge inspection method has some problems; for example, it takes time for the magnitude of the power-supply current to increase and become almost stable, and it is necessary for determination of the quality of a battery to compare between the magnitude of the stabilized power-supply current and the threshold current value, and others. Thus, the quality determination would be troublesome.

Meanwhile, the inventors found out that, regarding a battery charged and further subjected to a load, when this load is reduced, a battery voltage (an open voltage) may slightly lower.

The present disclosure has been made to address the above problems and has a purpose to provide am improved method for inspecting self-discharge of a power storage device and a method for producing the power storage device including this self-discharge inspection method.

Means of Solving the Problems (1) To achieve the above-mentioned purpose, one aspect of the present disclosure provides a method for inspecting self-discharge of a power storage device, wherein the power storage device has a property that while the power storage device is pressed under a load set to a first load and charged with a device voltage set to a first device voltage, when the load is reduced from the first load, the device voltage decreases below the first device voltage, wherein the method includes: a) detecting the first device voltage of the power storage device pressed under the first load and charged with the first device voltage; b) continuously applying a power-supply voltage equal in magnitude to the first device voltage from an external power supply to the power storage device; c) detecting a power-supply current flowing from the external power supply to the power storage device; d) determining a self-discharge state of the power storage device based on the detected power-supply current; and after start of the continuously applying b), before the power-supply current stabilizes, e) reducing the load applied to the power storage device from the first load by a load reduction amount.

The power storage device to be inspected by the foregoing inspection method has a property that when the load applied to this power storage device is reduced, the device voltage (the open voltage) decreases as described above.

In the foregoing inspection method, the detecting a) of the first device voltage of the power storage device, the continuously applying b) of the power-supply voltage equal to the first device voltage, the detecting c) of the power-supply current, and the determining d) of the self-discharge state are performed. In the inspection method, after the start of the continuously applying b), the reducing e) of the load applied to the power storage device from the first load by the load reduction amount (decrement) is additionally performed before the power-supply current stabilizes.

If the load is not changed, when the power-supply voltage is continuously applied in the continuously applying b), the device voltage gradually decreases by self-discharge of the power storage device and finally becomes stable.

In the foregoing inspection method, additionally, the load is reduced in the reducing e). This load reduction also enables the device voltage to lower. In other words, the load reduction can expedite the decrease of the device voltage. Thus, an improved new inspection method can be provided, in which the load reduction amount is appropriately set to enable early stabilization of the power-supply current as compared with a conventional art or the quality of the power storage device can be easily determined based on the behavior of the varying power-supply current.

As will be described later, the self-discharge inspection method for the power storage device described above can be performed in the production process of the power storage device, and also can be carried out for a power storage device in use or a used power storage device after being mounted on an automobile or the like or being placed alone on the market.

Further, examples of the power storage device may include a secondary battery such as a lithium-ion secondary battery and a capacitor such as an electric double layer capacitor and a lithium-ion capacitor.

The first device voltage is an open-circuit voltage that occurs between the terminals of the power storage device when the current externally flowing to the power storage device is set to zero. For measuring this first device voltage, it is indispensable to disconnect (open) the terminals of the power storage device from the circuit.

In the determining d), the self-discharge state is determined based on the power-supply current. Specifically, the determining d) may include a method for determining the self-discharge state by using a stabilized power-supply current that flows at the time when the power-supply current becomes stable and using a temporal change of the power-supply current until the stabilized power-supply current is reached. The method for determining the self-discharge state using the stabilized power-supply current may include, for example, firstly obtaining a value of the stabilized power-supply current in the power storage device under inspection, and additionally, determining the quality of the self-discharge state (good (OK) or not good (NG)) based on a difference in magnitude between a value of the stabilized power-supply current and a reference threshold current value or classifying the self-discharge state into several ranks, such as A, B, and C, according to the magnitude of the stabilized power-supply current.

On the other hand, the method for determining the self-discharge state based on the temporal change of the power-supply current until the stabilized power-supply current is reached may include for example firstly estimating an estimated stabilized power-supply current from the temporal change of the power-supply current before the stabilized power-supply current is reached, and additionally, determining the quality of the self-discharge condition (OK or NG) based on a difference in magnitude between the estimated stabilized power-supply current and a threshold current value or classifying the self-discharge state into several ranks, such as A, B, and C, according to the magnitude of the estimated stabilized power-supply current. Further, the determining method may also include a method for directly determining the quality of the self-discharge state of the power storage device or classifying the same, for example, based on an amount of change in the power-supply current per unit time or based on whether or not the power-supply current changes from increase to decrease.

The temporal change of the detected power-supply current means a variation with time in the power-supply current, which occurs during a period after the start of the continuously applying b) of the continuous power-supply voltage until the value of the power-supply current flowing to the power storage device becomes stable. For example, it can be indicated by an increment and an inclination of increase of the power-supply current that occurs during a predetermined period. At the time when a sufficient time elapses in the continuously applying b), a stable power-supply current flows corresponding to the magnitude of the self-discharge current flowing through the power storage device. This stable power-supply current is defined as a power-supply current in a stable state, namely, a stabilized power-supply current.

(2) In the method for inspecting self-discharge of a power storage device, described in (1), the reducing e) may be configured to: f) reduce the load applied to the power storage device after a lapse of a predetermined first time from the start of the continuously applying b), and the load reduction amount may be is a non-defective-product load reduction amount meeting the following conditions: (i) the power storage device is a non-defective device having good self-discharge characteristics; and (ii) when the load applied to the the non-defective device is reduced from the first load by the load reduction amount after a lapse of the predetermined first time from the start of the continuous applying b), the power-supply current sharply increases due to a decrease of the device voltage caused by the load reduction, and then quickly stabilizes.

In this inspection method, a load reduction amount for a non-defective product, which will be also referred to as a non-defective-product load reduction amount, is obtained in advance for a non-defective device having good self-discharge characteristics, that is, a non-defective device having a smaller self-discharge current than a threshold current value. Specifically, when the load applied to the non-defective device is reduced from the first load by a specified load reduction amount after a lapse of the first time from the start of the continuously applying b), the power-supply current sharply increases due to the decrease of the device voltage caused by the load reduction, and then quickly stabilizes. The above-mentioned specified load reduction amount is thus obtained in advance and referred to as the non-defective-product load reduction amount.

According to this inspection method, in the load reduction f), the load is reduced from the first load by the non-defective-product load reduction amount after a lapse of the first time from the start of the continuously applying b).

When the power storage device under inspection is a non-defective device, therefore, the power-supply current becomes stable quickly. In contrast, when the power storage device under inspection is a power storage device (e.g., a threshold device or a defective device, which will be mentioned later) having a larger self-discharge current than the non-defective device, the power-supply current sharply increases due to the decrease of the device voltage caused by the load reduction, but then it gradually increases for a while and finally stabilizes.

According to this inspection method, therefore, regardless whether the power storage device under inspection is a non-defective device or not, the quality of the power storage device can be determined quickly as compared with the conventional inspection method in which a power-supply current gradually increases due to the absence of the load reduction f).

The first time at which the load reduction f) starts after the start of the continuously applying b) may be set within at least ½ of the time required for the power-supply current to stabilize in the non-defective device (referred to as a stabilization achieving time) when the continuously applying b) is performed on the non-defective device without performing the load reduction f) after the start of the continuously applying b). This is because if the first time exceeds ½ of the stabilization achieving time, the effect of shortening the stabilization achieving time by execution of the load reduction f) becomes low. As a most preferable example, the first time may be set at the time immediately after the continuously applying b), e.g., within 30 seconds.

(3) In the method for inspecting self-discharge of a power storage device, described in (1), the reducing e) may be configured to: g) reduce the load applied to the power storage device after a lapse of a predetermined second time from start of the continuously applying b), the load reduction amount may be a threshold load reduction amount meeting the following conditions: (iii) the power storage device is a threshold device having a self-discharge current corresponding to a magnitude of a threshold current value; and (vi) when the load applied to the threshold device is reduced from the first load by the load reduction amount after a lapse of the predetermined second time from the start of the continuously applying b), the power-supply current sharply increases due to a decrease of the device voltage caused by the load reduction, and then quickly stabilizes.

In this inspection method, a load reduction amount for threshold, which will be also referred to as a threshold load reduction amount, is obtained in advance for a threshold device having a self-discharge current corresponding to a magnitude of a threshold current value. Specifically, when the load applied to the threshold device is reduced from the first load by a specified load reduction amount after a lapse of the second time from the start of the continuously applying b), the power-supply current sharply increases due to the decrease of the device voltage caused by the load reduction, and then quickly stabilizes. The above-mentioned specified load reduction amount is thus obtained in advance and referred to as the threshold load reduction amount.

According to this inspection method, in the load reduction g), the load is reduced from the first load by the threshold load reduction amount after a lapse of the second time from the start of the continuously applying b).

When the power storage device under inspection is a threshold device, therefore, the power-supply current becomes stable quickly. In contrast, when the power storage device under inspection is a defective device having a larger self-discharge current than the threshold device, the power-supply current sharply increases due to the decrease of the device voltage caused by the load reduction, but then it gradually increases for a while and finally stabilizes. Alternatively, when the power storage device under inspection is a non-defective device having a smaller self-discharge current than the threshold device, the power-supply current sharply rises due to the decrease of the device voltage caused by the load reduction, and then reversely rapidly decreases and stabilizes.

In other words, the behavior of the power-supply current depends on which one the power storage device under inspection is, the threshold device, the non-defective device, or the defective device. Accordingly, even if the power-supply current is not stable, the quality of the power storage device can be easily determined based on the detected power-supply current in the determining d).

In the determining d), the inspected device in which the power-supply current sharply increases and then reversely quickly decreases is determined to be a non-defective device and other devices are determined to be defective devices, so that the quality can be determined more rapidly than in the conventional art.

The "threshold current value" indicates either a reference current value to be used to determine the quality of the power storage device or a plurality of reference current values to be used to determine which one of a plurality of ranks the power storage device is classified into, by comparing with the current value of the self-discharge current of the power storage device charged to the first device voltage.

The second time at which the load reduction g) starts after the start of the continuously applying b) may be set within at least ½ of the time required for the power-supply current to stabilize in the non-defective device when the continuously applying b) is performed on the non-defective device without performing the load reduction g) after the start of the continuously applying b). This is because if the second time exceeds ½ of the stabilization achieving time, the effect of shortening the stabilization achieving time by execution of the load reduction g) becomes low. As a most preferable example, the second time may be set at the time immediately after the continuously applying b), e.g., within 30 seconds.

(4) To achieve the above purposes, another aspect of the present disclosure provides a method for producing a power storage device, the method including: h) initially charging an assembled and uncharged power storage device into a predetermined charge state to provide a previously-charged power storage device; and i) inspecting a self-discharge state of the initially charged power storage device by one of the foregoing self-discharge inspection methods (1) to (3) for a power storage device.

According to the method for producing the power storage device, the initially charging h) is performed and then the inspecting i) using the above-described self-discharge inspection method is carried out. Thus, a power storage device can be produced by inspecting the presence and the degree of a short-circuit in the initial stage of the power storage device with such an improved new inspection method.

Further, a high-temperature aging process to leave the power storage device in an open state under a high temperature and a cooling process subsequent thereto may be provided between the initially charging h) and the inspecting i), because these processes enable easier stabilization of the voltage of the power storage device.

DETAILED DESCRIPTION OF THE EXEMPLARY EMBODIMENTS

First Embodiment

Figure 1:
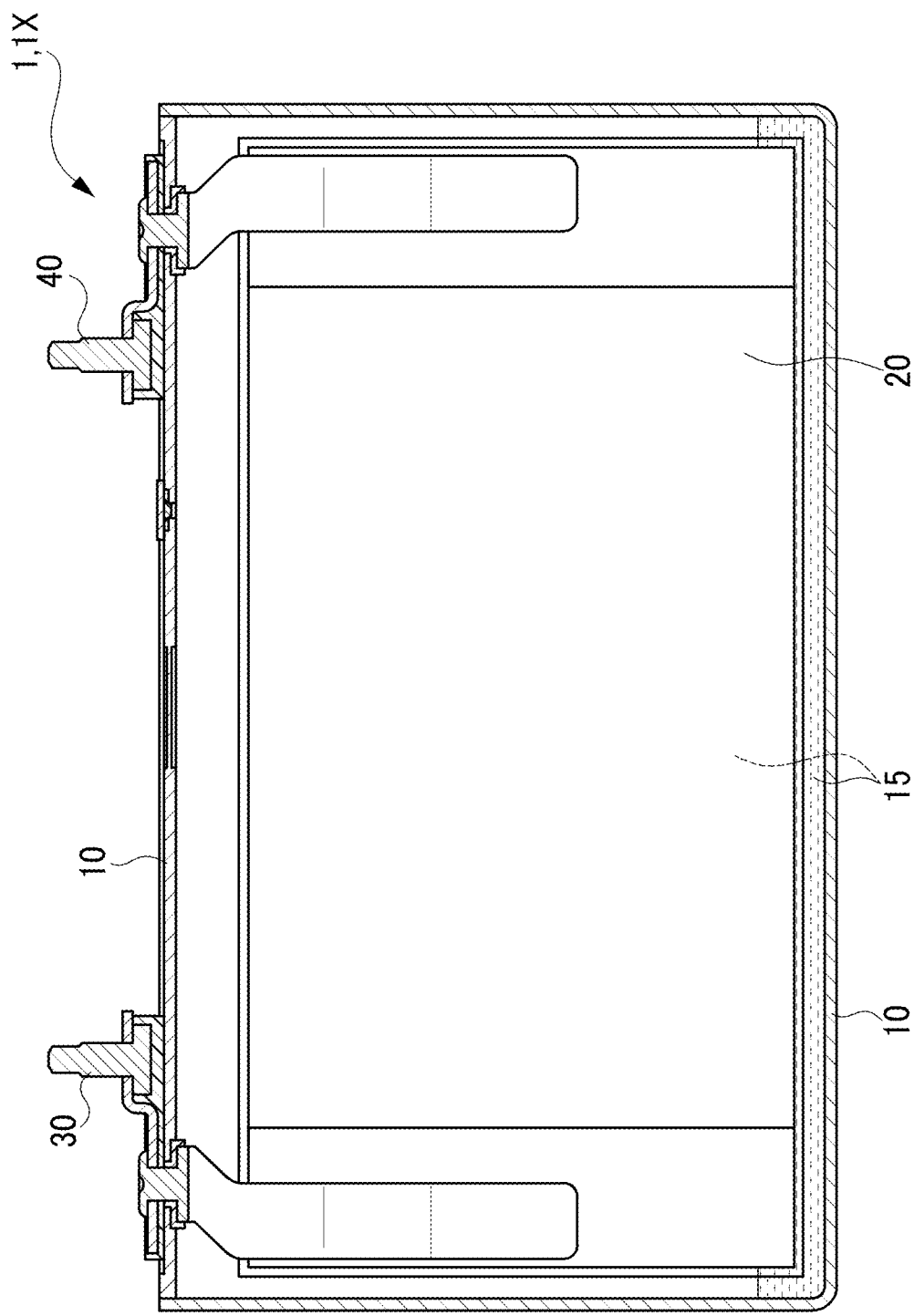
FIG. 1 is a longitudinal cross-sectional view of a battery in first and second embodiments and a first modified embodiment.

A detailed description of a first embodiment of this disclosure will now be given referring to the accompanying drawings. FIG. 1 is a longitudinal cross-sectional view of a lithium-ion secondary battery (hereinafter, also simply referred to as a battery) 1 in the first embodiment. This battery 1 includes a rectangular parallelepiped box-shaped battery case 10, a flat wound electrode body 20 and an electrolytic solution 15, which are accommodated in the battery case 10, a positive terminal member 30 and a negative terminal member 40 supported in the battery case 10, and others. In the first embodiment, the positive active material is a lithium transition metal composite oxide, specifically, lithium nickel cobalt manganese oxide, and the negative active material is carbon material, specifically, graphite. The same applies to batteries 1 in a first modified embodiment, a second embodiment, and a reference embodiment, which will be described later.

A self-discharge inspection method for determining the internal insulation property of the battery 1 and a method for producing the battery 1 including this self-discharge inspection method will be described below (see FIG. 2). In an assembly step S1, an uncharged battery 1X (see FIG. 1) is assembled. An initial battery voltage measurement step S7 to a load reduction step S12 which will be mentioned later also correspond to an inspection step in the method for producing the batteries 1.

Figure 3:
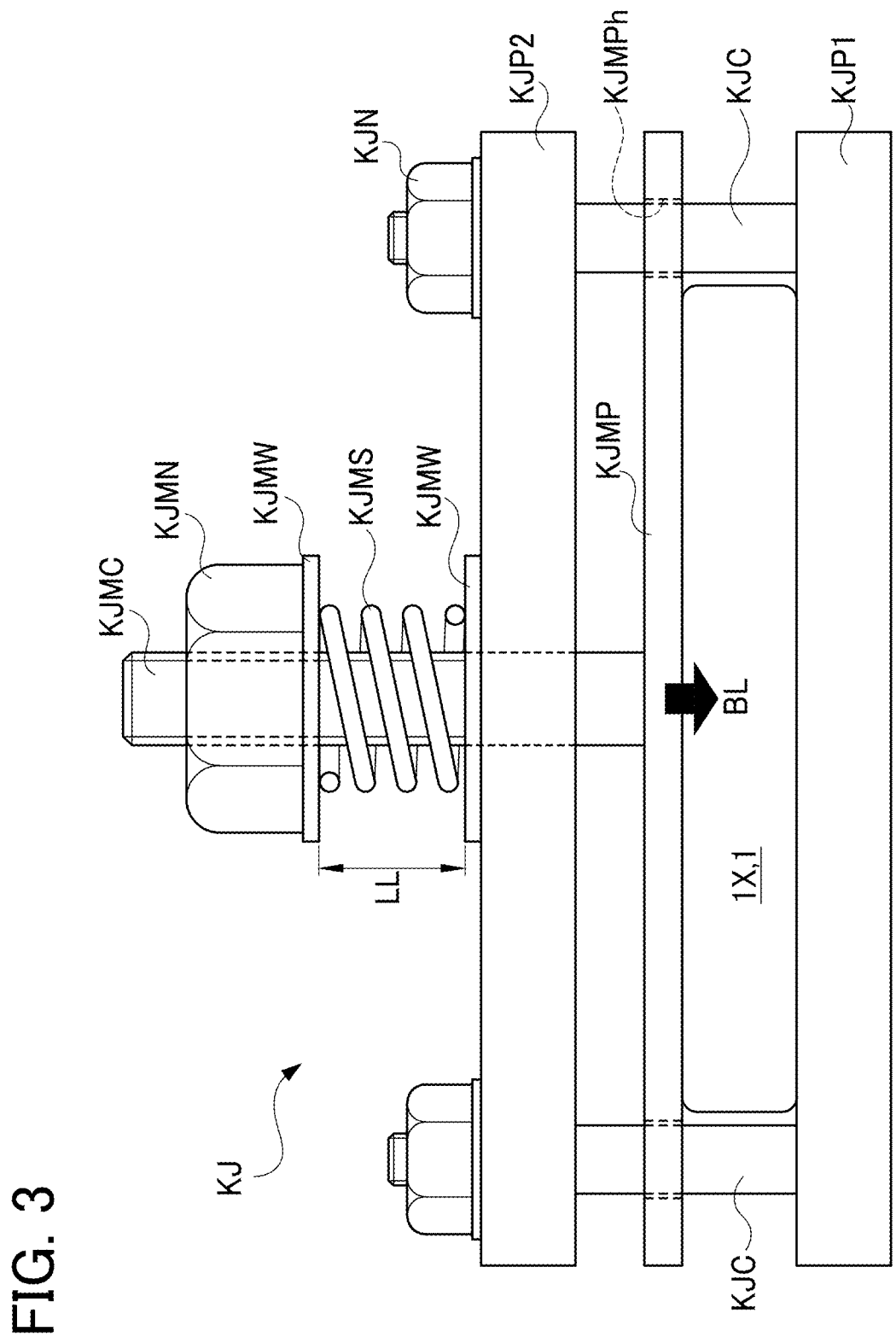
FIG. 3 is a side view of a jig configured to increase and decrease a load, showing a state where the battery in the first and second embodiments and the first modified embodiment is placed in the jig.

In a load application step S2, subsequently, as a load BL on the assembled battery 1X (which eventually becomes a battery 1), a predetermined first load BL1 is applied to the battery 1X. This first load BL1 is for example 918 kgf, i.e., 9 kN, in the first embodiment. Specifically, as shown in FIG. 3, the battery 1 (the battery 1X) is restrained in an elastically compressed state under the first load BL1 in a battery thickness direction corresponding to a perpendicular direction to the paper sheet of FIG. 1 by use of a restraining jig KJ. More specifically, using the restraining jig KJ having two fixed plates, i.e., a lower fixed plate KJP1 and an upper fixed plate KJP2 in the figure, which are fixedly spaced from each other with support rods KJC and securing nuts KJN, the battery 1 (the battery 1X) is sandwiched between the lower fixed plate KJP1 and a pressure plate KJMP. A rod-shaped pressing member KJMC is elastically pushed by use of its male screw part KJMCs, a pressing nut KJMN, and a compression spring KJMS held between two washers KJMW to apply a load BL onto the battery 1 (the battery 1X).

As a preparatory work, a load cell (not shown) instead of the battery 1 is put between the fixed plate KJP1 and the pressure plate KJMP, and then the pressing nut KJMN is tightened, so that the relationship between the length LL of the compression spring KJMS (i.e., the distance between the washers KJMW located on both sides of the compression spring KJMS) and the load applied to the load cell is obtained in advance. Accordingly, the magnitude of the load BL applied to the battery 1 by the restraining jig KJ can be detected by measurement of the length LL of the compression spring KJMS.

Under the first load BL1 continuously applied to the battery 1 (the battery 1X) as above, the battery 1 undergoes an initial charge step S3 to a continuation judgement step S10 mentioned later and a load reduction step S12. In each step, an ambient temperature TK around the battery 1 is detected by use of a temperature detecting device KTS having a temperature sensor KT including a thermistor. Further, a battery temperature TB of the battery 1 is detected by a temperature detecting device STS having a temperature sensor ST including a thermistor placed in contact with the battery case 10 at a predetermined position (see FIG. 4).

In the initial charge step S3, the uncharged battery 1X is charged initially, i.e., for the first time, to provide a charged battery 1. Specifically, under an initial charge temperature FT (20° C.), a charge and discharge device (not shown) is connected to the terminal members 30 and 40 of the battery 1X restrained with the restraining jig KJ to charge the battery 1X for the first time with a constant current constant voltage (CCCV) until the battery voltage VB of the battery 1X reaches a predetermined value (e.g., 4.0 V in the present embodiment).

In a high-temperature aging step S4, subsequently, the batteries 1 initially charged are left to stand for an aging period EK (EK=20 hours) under an aging temperature ET (ET=63° C.) while both the terminal members 30 and 40 of each battery 1 are opened. This high-temperature aging causes the battery voltage VB of each battery 1 to decrease to a battery voltage corresponding to about 80% SOC.

In a cooling step S5, the batteries 1 are placed in a cooling chamber CR under a cooling temperature CT (CT=20° C.) for 20 minutes and forcibly cooled with a fan to adjust the battery temperature TB to approximately 20° C., i.e., TB≈20° C. (see FIG. 2).

Figure 2:
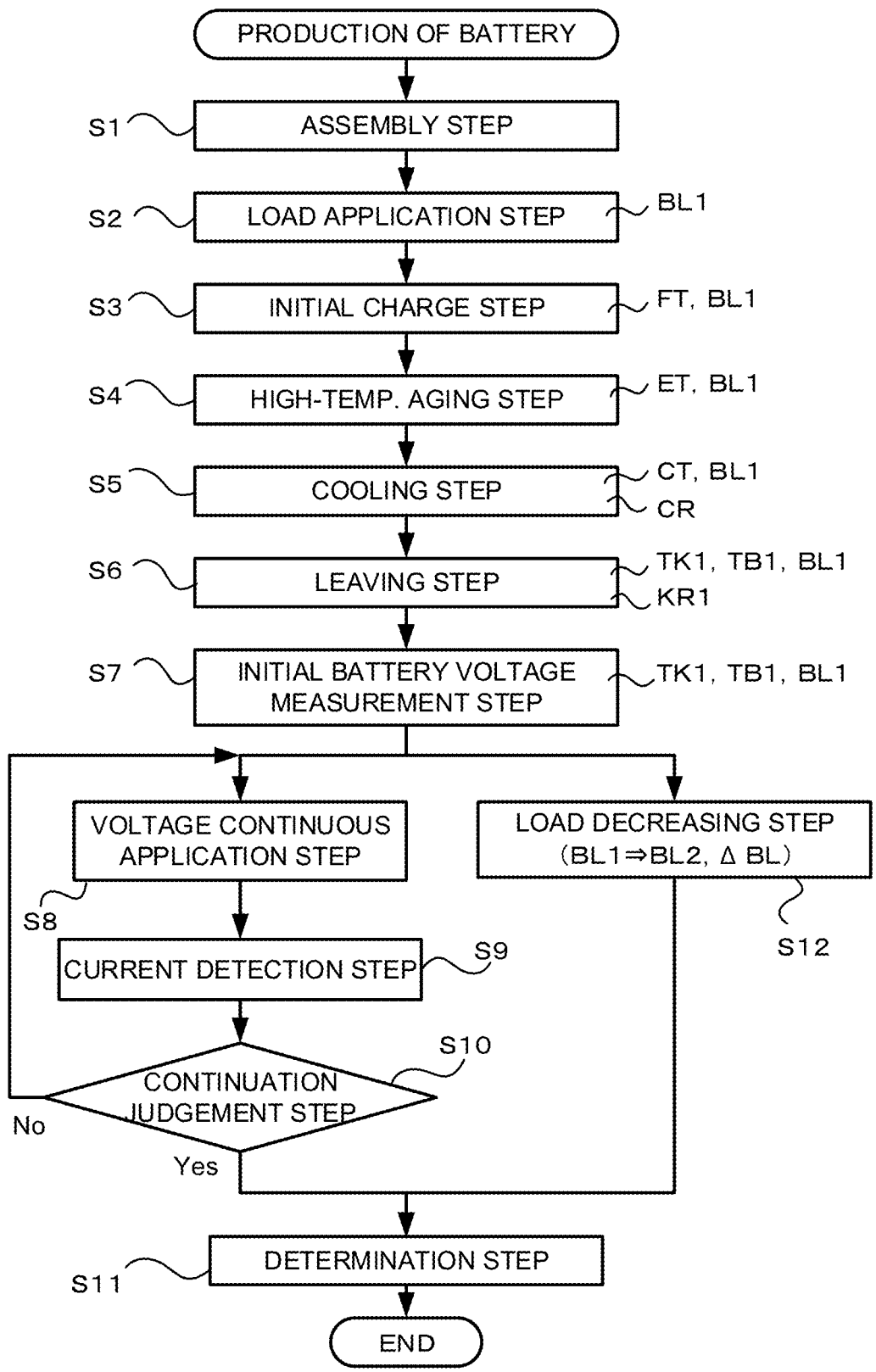
FIG. 2 is a flowchart of a process of producing a battery, including a battery self-discharge inspection process in the first and second embodiments and the first modified embodiment.

In a leaving step S6, furthermore, the batteries 1 are transferred into a first chamber KR1 with the ambient temperature TK controlled to a first ambient temperature TK1 (TK1=20.0° C.), and left to stand for a leaving period HP (e.g., HP=30 minutes) to regulate the battery temperature TB of each battery 1 to a battery temperature TB1 (TB1=20.0° C.) equal to the first ambient temperature TK1 (see FIG. 2). After the leaving step S6, the initial battery voltage measurement step S7 through the continuation judgement step S10 which will be described later are also performed under the condition that the battery temperature TB of each battery 1 is the first battery temperature TB1.

Figure 4:
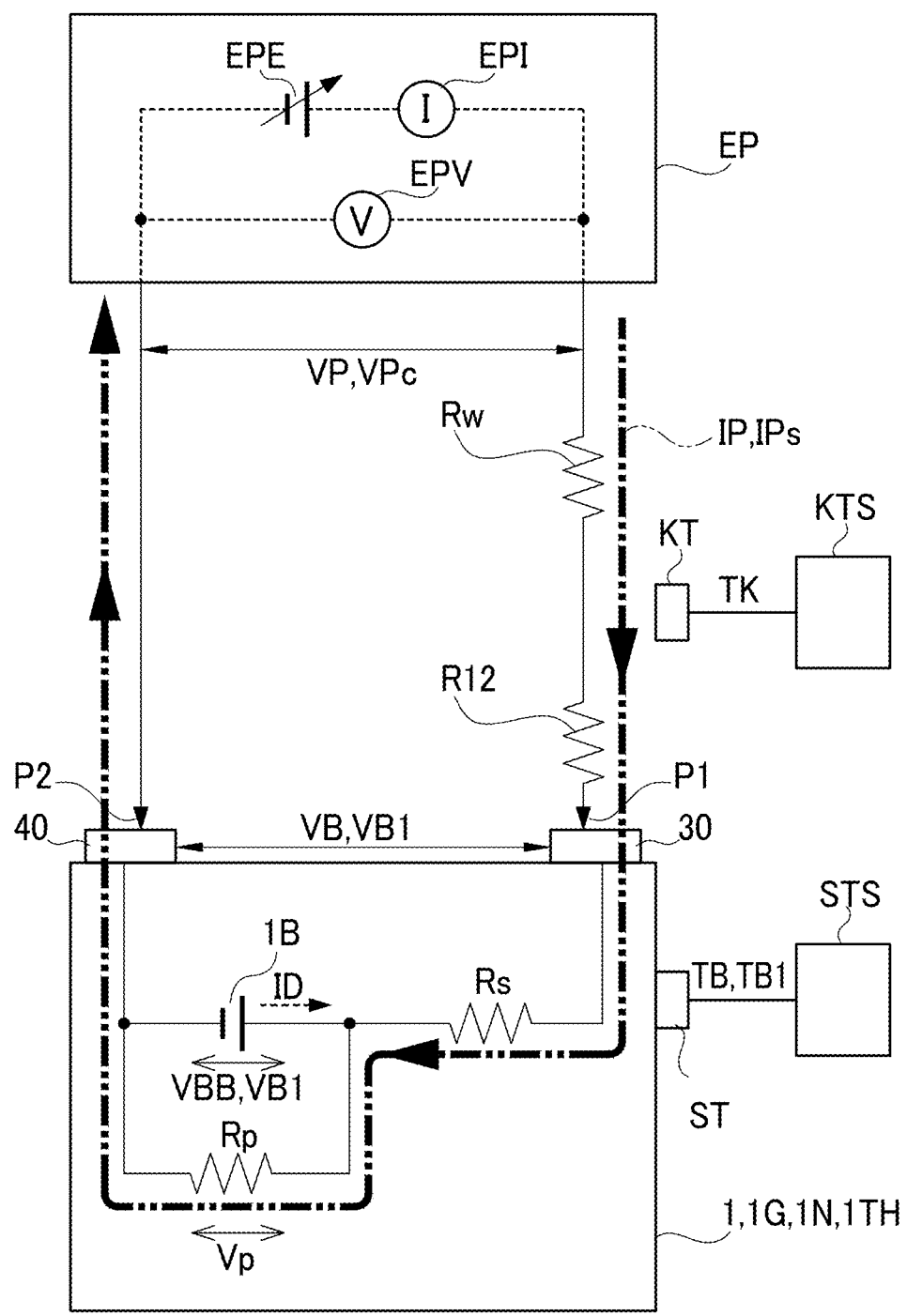
FIG. 4 is a circuit diagram related to a self-discharge inspection method for the battery in the first and second embodiments and the first modified embodiment, showing a state where an external power supply is connected to the battery.

In the initial battery voltage measurement step S7, under the first ambient temperature TK1, a first battery voltage VB1 corresponding to an open voltage of each battery 1 regulated at the first battery temperature TB1 (TB=20.0° C.) is measured. Specifically, as shown in FIG. 4, a pair of probes P1 and P2 of an external power supply EP1 are respectively brought into contact with the positive terminal member 30 and the negative terminal member 40 of each battery 1 to connect the external power supply EP to each battery 1. A power-supply current IP flowing from the external power supply EP to each battery 1 is set to zero (IP=0, corresponding to a state where a DC voltage supply EPE is disconnected) and the first battery voltage VB1 of each battery 1 is measured with a voltmeter EPV.

The external power supply EP used in the first and second embodiments and the first modified embodiment shown in FIG. 4 is a variable constant-voltage constant-current power supply that can variably and precisely control a power-supply voltage VP to be generated in the DC voltage supply EPE. This external power supply EP further includes an ammeter EPI capable of precisely measuring a power-supply current IP to be supplied from the external power supply EP to the battery 1 as well as the voltmeter EPV capable of precisely measuring the power-supply voltage VP to be applied to the battery 1.

In FIG. 4, a wiring resistance Rw indicates a wiring resistance distributed in the external power supply EP and from the external power supply EP to the probes P1 and P2. A contact resistance R12 indicates the sum of the contact resistance generated between the first probe P1 of the external power supply EP and the positive terminal member 30 of the battery 1 and the contact resistance generated between the second probe P2 of the external power supply EP and the negative terminal member 40 of the battery 1.

FIG. 4 also shows an equivalent circuit of the battery 1 (a non-defective battery 1G, a defective battery 1N, and a threshold battery 1TH) including a battery component 1B, a DC resistance Rs, and a short-circuit resistance Rp. The battery component 1B is a capacitance component provided by the battery 1 and assumed to generate a battery component voltage VBB. The DC resistance Rs is a battery resistance that appears to exist in series with the battery component 1B between the both terminal members 30 and 40 of the battery 1. In contrast, the short-circuit resistance Rp is a resistance representing a magnitude of self-discharge caused by an internal short-circuit of the battery 1. A self-discharge current ID indicated by an arrowed broken line indicates a self-discharge current flowing from the battery component 1B to the short-circuit resistance Rp.

The battery component voltage VBB coincides with the battery voltage VB when the power-supply current IP is zero (IP=0). In the initial battery voltage measurement step S7, the first battery voltage VB1 is only measured. Therefore, at the start of the subsequent voltage continuous application step S8 (the voltage application time t=0), the battery component voltage VBB generated by the battery component 1B is equal to the first battery voltage VB1 (VBB=VB1, t=0).

While the first probe P1 remains in contact with the positive terminal member 30 and the second probe P2 remains in contact with the negative terminal member 40, i.e., the pair of probes P1 and P2 are neither disconnected nor reconnected to the terminal members 30 and 40, the initial battery voltage measurement step S7 through the continuation judgement step S10 mentioned later are performed. The same applies to the first modified embodiment and the second embodiment. This is to prevent the contact state of the probe P1 with the terminal member 30 and the contact state of the probe P2 with the terminal member 40 from becoming different every time they are disconnected and reconnected, and thus avoid variation in the magnitude of the contact resistance R12 generated between the probe P1 and the positive terminal member 30 and between the probe P2 and the negative terminal member 40.

In each of the first and second embodiments and the first modified embodiment, the behaviors of two or more batteries 1 (non-defective batteries 1G, defective batteries 1N, and threshold batteries 1TH) will be considered below; however, the batteries 1 differ from each other only in the short-circuit resistance Rp and the magnitude of a self-discharge current ID flowing through this resistance Rp for easy consideration. The capacitance of the battery component 1B and the magnitude of the DC resistance Rs are assumed to be the same (equal) between the batteries 1. The wiring resistance Rw and the contact resistance R12 are also assumed to be equal between the batteries 1. Further, in the initial battery voltage measurement step S7 and at the beginning (a voltage application time t=0) of the voltage continuous application step S8, the batteries 1 are also equal to each other in the first battery voltage VB1, that is, the magnitude of the battery component voltage VBB of the battery component 1B.

In the voltage continuous application step S8, successively, under the first ambient temperature TK1, when the first battery temperature TB1 becomes equal to the first ambient temperature TK1, the DC voltage supply EPE of the external power supply EP is caused to generate a continuous power-supply voltage VPc equal to the first battery voltage VB1 (VPc=VB1) that is obtained in the foregoing initial battery voltage measurement step S7. Then, voltage application to the battery 1 is started (the voltage application time t=0) and, from this point forward, the continuous power-supply voltage VPc is continuously applied. Specifically, the continuous power-supply voltage VPc generated in the external power supply EP is maintained at a magnitude equal to the first battery voltage VB1 obtained in the beginning. Because of VPc=VB1 as above, accordingly, the power-supply current IP does not flow to the battery 1 in the beginning of the voltage continuous application step S8 as in JP 2019-016558A. In parallel with this voltage continuous application step S8, as shown in FIG. 2, the load reduction step S12 mentioned later is also performed.

In a current detection step S9, the power-supply current IP is detected by the ammeter EPI. Specifically, the power-supply current value IP(n) (wherein n is an integer of 0 or more and indicates the order of acquisition) of the power-supply current IP flowing from the external power supply EP to the battery 1 is acquired at every predetermined elapsed time, e.g., at intervals of 10 seconds in the present embodiment. The power-supply current value IP(0) of the power-supply current IP in the beginning of application of the continuous power-supply voltage VPc (the voltage application time t=0) becomes zero (IP(0)=0). Then, as the voltage application time t passes, the power-supply current IP (the power-supply current value IP(n)) gradually increases to approach the magnitude of a unique self-discharge current ID different between the batteries 1 (see the referential embodiment). In the first embodiment, however, since the load BL applied to the battery 1 is reduced in the load reduction step S12 mentioned later, the power-supply current IP (the power-supply current value IP(n)) sharply increases as the load BL is reduced, and thereafter, the power-supply current IP (the power-supply current value IP(n)) changes toward the magnitude of the self-discharge current ID of the battery 1 and finally stabilizes thereat.

In the continuation judgement step S10, it is determined whether to repeat the voltage continuous application step S8 and the current detection step S9 again. In the first embodiment, specifically, it is determined whether the power-supply current IP (concretely, the power-supply current value IP(n)) has stabilized after the start of application of the continuous power-supply voltage VPc to the battery 1. Herein, if No, i.e., if the power-supply current IP is not stable, the process returns to the voltage continuous application step S8 to continue apply the continuous power-supply voltage VPc to the battery 1 (S8) and further detect the power-supply current IP again (S9). In contrast, if Yes, i.e., if the power-supply current IP is stable, the process advances to the determination step S11 which will be described later.

In the continuation judgement step S10, the method for determining whether the power-supply current IP has stabilized may include for example sequentially calculating a moving average of the power-supply current values IP(n) (e.g., a moving average of seven power-supply current values IP(n−6) to IP(n) obtained for last 60 seconds) and determining whether the power-supply current value IP(n) has stabilized based on the transition of the moving average values (e.g., the magnitude of a difference value or a derivative value of the moving average values).

In the load reduction step S12 performed in parallel to the voltage continuous application step S8, during a period before the power-supply current IP stabilizes after the start of the voltage continuous application step S8 (the voltage application time t>0), after a lapse of a predetermined first time t1 (t=t1) from the start (t=0), the load BL applied to the battery 1 is reduced from the foregoing first load BL1 by a load reduction amount $\Delta BL$. In the first embodiment, the first time t1 is set to 5.0 minutes (=300 seconds) and a load reduction amount $\Delta BL$ is set to a load reduction amount $\Delta BLg2$ for a non-defective product (also referred to as a "non-defective-product load reduction amount"). In this case, the following study is given to how the power-supply current value IP(n) of the power-supply current IP flowing from the external power supply EP to the battery 1 changes.

Reference Embodiment

Figure 5:
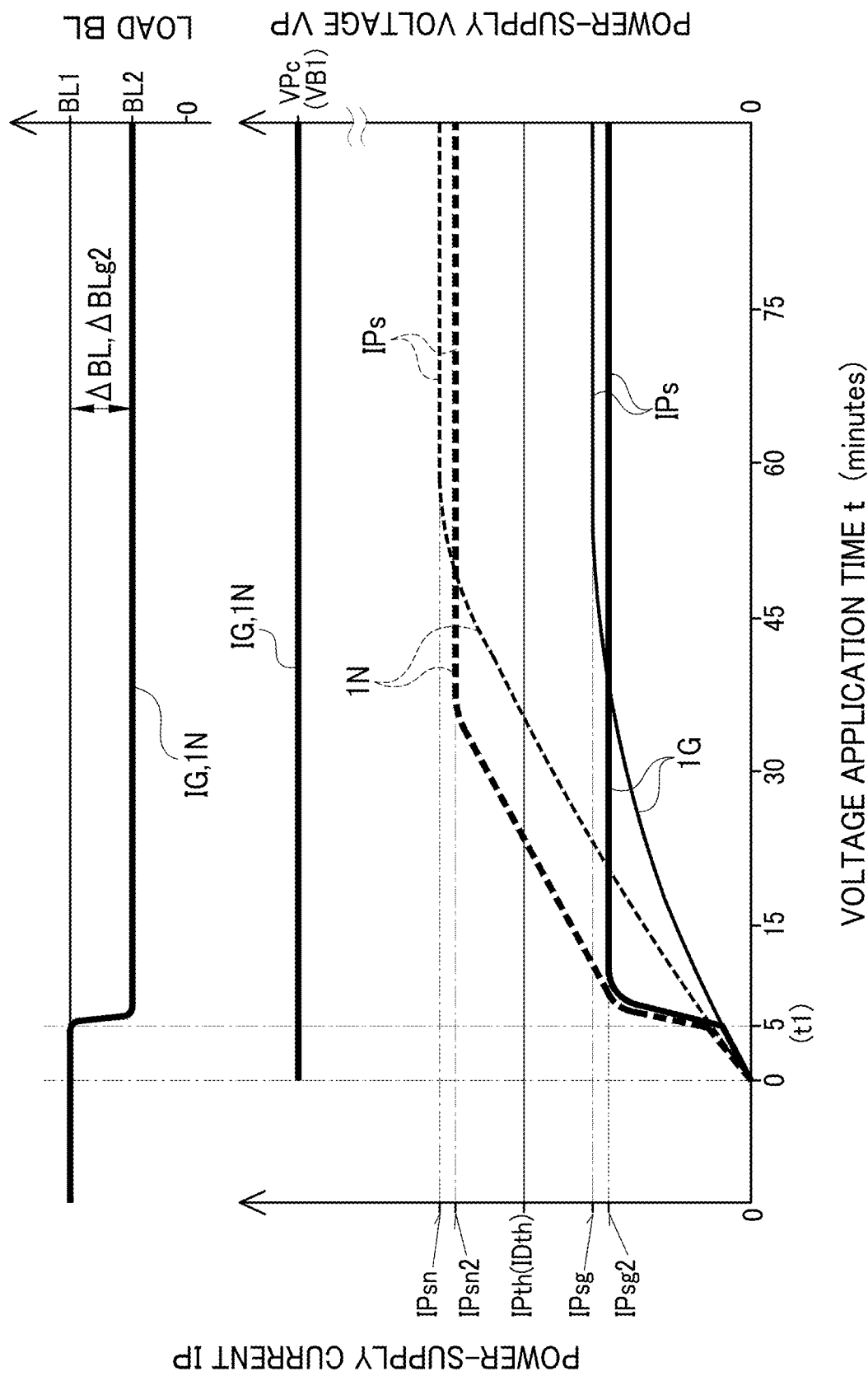
FIG. 5 is a graph schematically showing temporal changes in power-supply voltage, load, and power-supply current, with respect to a voltage application time in each of non-defective batteries and defective batteries in the first embodiment and a reference embodiment.

Herein, as a reference embodiment, the following consideration is made referring to FIGS. 4 and 5 about the method described in JP 2019-016558 A, that is, how the power-supply current IP changes while the continuous power-supply voltage VPc equal to the first battery voltage VB1 is continuously applied from the external power supply EP to the battery 1 after the start of the voltage application (t=0), as shown by a thick solid line in a middle part of FIG. 5. The load BL applied to the battery 1 is assumed to be constant at the first load BL1 as indicated by a thin solid line in an upper part of FIG. 5.

When the first battery voltage VB1 is continuously applied from the external power supply EP to the battery 1, the battery component voltage VBB of the battery component 1B gradually decreases with the lapse of the voltage application time t from the first battery voltage VB1 occurring at the start of the voltage continuous application step S8 (the voltage application time t=0). This is because the electric charge stored in the battery component 1B is gradually discharged by the self-discharge current ID through the short-circuit resistance Rp.

Therefore, the power-supply current IP does not flow (IP(0)=0) in the beginning of application of the first battery voltage VB1 (the voltage application time t=0). However, when the battery component voltage VBB generated by the battery component 1B decreases, a potential difference (VB1−VBB) is generated between both ends of the series resistance of three resistances, that is, the DC resistance Rs, the contact resistance R12, and the wiring resistance Rw, as can be easily understood from FIG. 4. Thus, the corresponding power-supply current IP flows to the battery 1 through a path as indicated by an arrowed two-dot chain line (VB1=VBB+(Rs+R12+Rw)·IP).

Then, as indicated by a thin solid line and a thin broken line in a lower part of FIG. 5, the magnitude of the power-supply current IP in this reference embodiment gradually increases as the battery component voltage VBB of the battery component 1B decreases. However, as can be understood from FIG. 4, when the power-supply current IP increases as the battery component voltage VBB decreases, and the back electromotive force Vp (=Rp·IP) generated in the short-circuit resistance Rp becomes equal to the battery component voltage VBB generated in the battery component 1B, the self-discharge current ID no longer flows out from the battery component 1B. As a result, the battery component voltage VBB of the battery component 1B also stops decreasing. The power-supply current IP then becomes stable as a stabilized power-supply current IPs equal to the self-discharge current ID.

Thus, if the battery 1 to be inspected is a non-defective battery 1G, i.e., a battery having a large short-circuit resistance Rp and a self-discharge current ID smaller than the threshold current value IDth, the battery component voltage VBB of the battery component 1B slowly decreases and hence the power-supply current IP also slowly increases (see the thin solid line in the lower part of FIG. 5). Further, a stabilized power-supply current value IPsg of this non-defective battery 1G is small; for example, a value IPsg of a typical non-defective battery 1G is assumed to be 15 μA (IPsg=15 μA).

In contrast, when the battery 1 to be inspected is a defective battery 1N, i.e., a battery having a small short-circuit resistance Rp as compared with the non-defective battery 1G and a self-discharge current ID larger than the threshold current value IDth, the battery component voltage VBB of the battery component 1B relatively significantly decreases as compared with the non-defective battery 1G and thus the power-supply current IP also relatively greatly increases (see the thin broken line in the lower part of FIG. 5). A stabilized power-supply current value IPsn of this defective battery 1N is also larger than the stabilized power-supply current value IPsg of the non-defective battery 1G; for example, the stabilized power-supply current value IPsn of a typical defective battery 1N is assumed to be 27 μA which is larger than IPsg (IPsn=27 μA>IPsg).

Therefore, the quality of the battery 1 under inspection can be determined based on the stabilized power-supply current value IPs (IPsg, IPsn) or the value and the changing state of an increase rate of the power-supply current IP (i.e., a temporal change in the power-supply current IP) (see JP 2019-016558 A). For example, in the lower graph of FIG. 5, a threshold current value IPth of the power-supply current IP, equal to the threshold current value IDth of the self-discharge current ID, is set to an intermediate value between the stabilized power-supply current value IPsg of the non-defective battery 1G and the stabilized power-supply current value IPsn of the defective battery 1N (e.g., IPth is assumed to be 20 μA), as indicated by the thin solid line in FIG. 5. Accordingly, it is possible to determine the quality of the relevant battery 1 by comparison between the obtained stabilized power-supply current value IPs (IPsg, IPsn) and the threshold current value IPth.

In the foregoing method of the reference embodiment, however, it takes time from the start of application of the continuous power-supply voltage VPc to the battery 1 (t=0) until determination of the quality of the battery 1 is enabled. For performing the determination by obtaining the value of the stabilized power-supply current IPs, for example, in the above-mentioned example indicated by the thin solid line and the thin broken line in the lower graph in FIG. 5, it is necessary to wait until the voltage application time t passes 55 minutes or more to obtain the value (IPsg, IPsn) of the stabilized power-supply current IPs.

The reason why it takes long until determination of the quality of the battery 1 is enabled in the conventional art is because the battery component voltage VBB could only be decreased gradually.

In the first embodiment, therefore, as shown by a thick solid line in the middle graph in FIG. 5, every battery 1 to be inspected is continuously applied with the continuous power-supply voltage VPc from the start of the voltage continuous application step S8 (the voltage application time t=0). Further, as indicated by a thick solid line in the upper graph in FIG. 5, at the time when the first time t1 elapses (t1=5.0 minutes in the present embodiment), the load BL applied to the battery 1 is rapidly reduced from the first load BL1 to a second load BL2, that is, reduced within 1 minute, e.g., 10 seconds in the first embodiment. The load reduction amount $\Delta BL$ (=BL1−BL2) is set to a non-defective-product load reduction amount $\Delta BLg2$, which is determined as below.

For the non-defective batteries 1G, specifically, at the time when the first time t1 (=5.0 minutes) elapses from the start of voltage continuous application step S8, the load BL is reduced from the first load BL1 by the load reduction amount ΔBL, which is variously set different in magnitude between the batteries 1G. From among these various load reduction amounts ΔBL, one load reduction amount ΔBL with which the power-supply current is sharply increased by reduction of the load BL and then quickly stabilizes is obtained as the non-defective-product load reduction amount ΔBLg2. Specifically, the load reduction amount ΔBL having such a magnitude as to cause the power-supply current IP to sharply increase and most quickly stabilize without gradually increasing or reversely decreasing is set as the non-defective-product load reduction amount ΔBLg2. This non-defective-product load reduction amount ΔBLg2 substantially corresponds to a magnitude of a load reduction amount ΔBL that causes, in a battery 1, a voltage drop that corresponds to the product (ΔIP·(Rs+R12+Rw)) of (i) a difference current ΔIP (=IPsg−IP(t1)) between the power-supply current IP(t1) flowing through the non-defective battery 1G at the point of first time t1 before load change and the stabilized power-supply current IPsg of the non-defective battery 1G in the reference embodiment performing no load reduction, and (ii) the series resistance (Rs+R12+Rw) of the three resistances, i.e., the DC resistance Rs, the contact resistance R12, and the wiring resistance Rw.

Herein, assuming that the battery 1 is to be inspected is a non-defective battery 1G, the following consideration is made. In this case, as indicated by a thick solid line in the lower graph in FIG. 5, the power-supply current IP gradually increases until the first time t1 elapses from the start of the voltage continuous application step S8, i.e., until the start of the load reduction step S12, as with the non-defective battery 1G in the reference embodiment indicated by the thin solid line. In contrast, after a lapse of the first time t1, the power-supply current IP sharply increases due to the decrease of the battery component voltage VBB caused by reduction of the load BL applied to the battery 1 by the non-defective-product load reduction amount ΔBLg2. When the load BL lowers down to a second load BL2, the power-supply current IP quickly converges to the stabilized power-supply current value IPsg2 of the non-defective battery 1G under a new load (the second load BL2) and then remains at this stabilized power-supply current value IPsg2. Herein, as can be easily understood by comparison with the reference embodiment indicated by the thin solid line, it is revealed from comparison of the non-defective batteries 1G between the first embodiment and the reference embodiment that the method of the first embodiment can more greatly shorten the time required for the power-supply current IP to stabilize than the reference embodiment.

Furthermore, assuming that the battery 1 to be inspected is a defective battery 1N, the following consideration is made. Also in this case, as indicated by a thick broken line in the lower graph in FIG. 5, the power-supply current IP gradually increases until the first time t1 elapses from the start of voltage continuous application step S8, i.e., until the start of load reduction step S12, as with the defective battery 1N in the reference embodiment indicated by the thin broken line. In contrast, after a lapse of the first time t1, the power-supply current IP sharply increases due to the decrease of the battery component voltage VBB caused by reduction of the load BL applied to the battery 1 by the non-defective-product load reduction amount ΔBLg2. However, differently from the forgoing case of the non-defective battery 1G, after the load BL becomes the second load BL2, the power-supply current IP gradually increases for a while and then finally stabilizes. In other words, the power-supply current IP gradually increases to a stabilized power-supply current value IPsn2 of the defective battery 1N under a new load (the second load BL2) and then reaches and stabilizes at the stabilized power-supply current value IPsn2. Herein, as can be easily understood by comparison with the reference embodiment indicated by the thin broken line, it is also revealed from comparison of the defective batteries 1N between the first embodiment and the reference embodiment that the method of the first embodiment can more greatly shorten the time required for the power-supply current IP to stabilize than the reference embodiment.

Consequently, regardless whether the battery 1 is the non-defective battery 1G or the defective battery 1N, the first embodiment enables earlier determination of the self-discharge state of the battery 1 in the determination step S11 as compared with the reference embodiment.

Comparing the non-defective batteries 1G between the first embodiment and the reference embodiment, the stabilized power-supply current value IPsg2 under the second load BL2 in the first embodiment is a slightly smaller value than in the reference embodiment, that is, than the stabilized power-supply current value IPsg under the first load BL1. Similarly, comparing the defective batteries 1N between the first embodiment and the reference embodiment, the stabilized power-supply current value IPsg2 under the second load BL2 in the first embodiment is a slightly smaller value than in the reference embodiment, that is, than the stabilized power-supply current value IPsg under the first load BL1. This is because a battery subjected to a smaller load BL has a smaller self-discharge current ID.

In a determination step S11, the self-discharge state of the battery 1 is determined based on the obtained power-supply current IP, concretely, by use of the sequence of the power-supply current values IP(0), IP(1), IP(n) which are obtained after the start of the voltage continuous application step S8 (the voltage application time t=0).

To be specific, in the first embodiment, from among a series of power-supply current values IP(0), IP(1), IP(n) obtained at predetermined time intervals (every 10 seconds in the present embodiment), seven power-supply current values IP(n−6) to IP(n) obtained in the terminal stage (the end stage) of the voltage continuous application step S8 (for the last 60 seconds in the present embodiment) are used. These values are averaged to calculate an average terminal power-supply current value IPE (IPE=(IP(n−6)+ . . . +IP(n))/7). The average terminal power-supply current value IPE indicates a magnitude of the stabilized power-supply current IPs obtained in the terminal stage of the voltage continuous application step S8. This is compared with the threshold current value IPth and a battery 1 having a smaller average terminal power-supply current value IPE than the threshold current value IPth (IPE<IPth) is determined to be a non-defective battery 1G. Thus, a battery 1 (a non-defective battery 1G) having been charged and inspected for its self-discharge state can be produced.

In contrast, a battery 1 of which the average terminal power-supply current value IPE is equal to or larger than the threshold current value IPth (IPE≥IPth) is determined to be a defective battery 1N. The battery 1 determined to be the defective battery 1N is excluded and discarded or alternatively is reused after disassembly and so on.

In the foregoing first embodiment, in the determination step S11, e.g., a plurality of power-supply current values IP(n) obtained in the terminal stage are averaged to calculate the average terminal power-supply current value IPE corresponding to a value of the stabilized power-supply current IPs, and this calculated value is compared with the threshold current value IPth to determine the quality of the battery 1.

However, among the moving average values MIP(n) obtained in the continuation judgement step S10 from the plurality of (e.g., seven) power-supply current values IP(n−6) to IP(n) obtained most recently, the last moving average value MIP(n) may be set to the foregoing average terminal power-supply current value IPE to determine the self-discharge state of the battery 1 in the determination step S11. In the determination step S11, specifically, the quality of the battery 1 may be determined by comparison between the moving average value MIP(n) finally obtained in the continuation judgement step S10 and the threshold current value IPth.

As described above, the method of the first embodiment can provide an improved new inspection method based on the self-discharge inspection including the initial battery voltage measurement step S7 to the determination step S11 and the load reduction step S12. Further, in the production method for the battery 1 in the first embodiment, the inspection process including the initial battery voltage measurement step S7 to the determination step S11 and the load reduction step S12 is performed after the initial charge step S3. Therefore, the battery 1 can be produced through the inspection about the presence/absence and the degree of a short-circuit in the initial stage of the battery 1 with such an improved new inspection manner.

In the inspection method of the first embodiment, after a lapse of the first time from the start of the voltage continuous application step, the load BL applied to the inspected battery 1 is reduced by the non-defective-product load reduction amount ΔBLg2. Thus, regardless whether the battery 1 to be inspected is a non-defective battery 1G or not, the quality of the power storage device can be determined more quickly than in the conventional inspection method.

First Modified Embodiment

In the above-described first embodiment (see FIG. 5), the load reduction step S12 is performed to reduce the load BL of the battery 1 by the non-defective-product load reduction amount ΔBLg2 after a lapse of the first time t1 from the start of the voltage continuous application step S8, in which the first time t1 is concretely 5.0 minutes. As an alternative, the load reduction step S12 may be performed at either after the start of the voltage continuous application step S8 or before stabilization of the power-supply current IP. However, as can be easily understood, it is most preferable to perform the load reduction step S12 immediately after the start of the voltage continuous application step S8.

Figure 6:
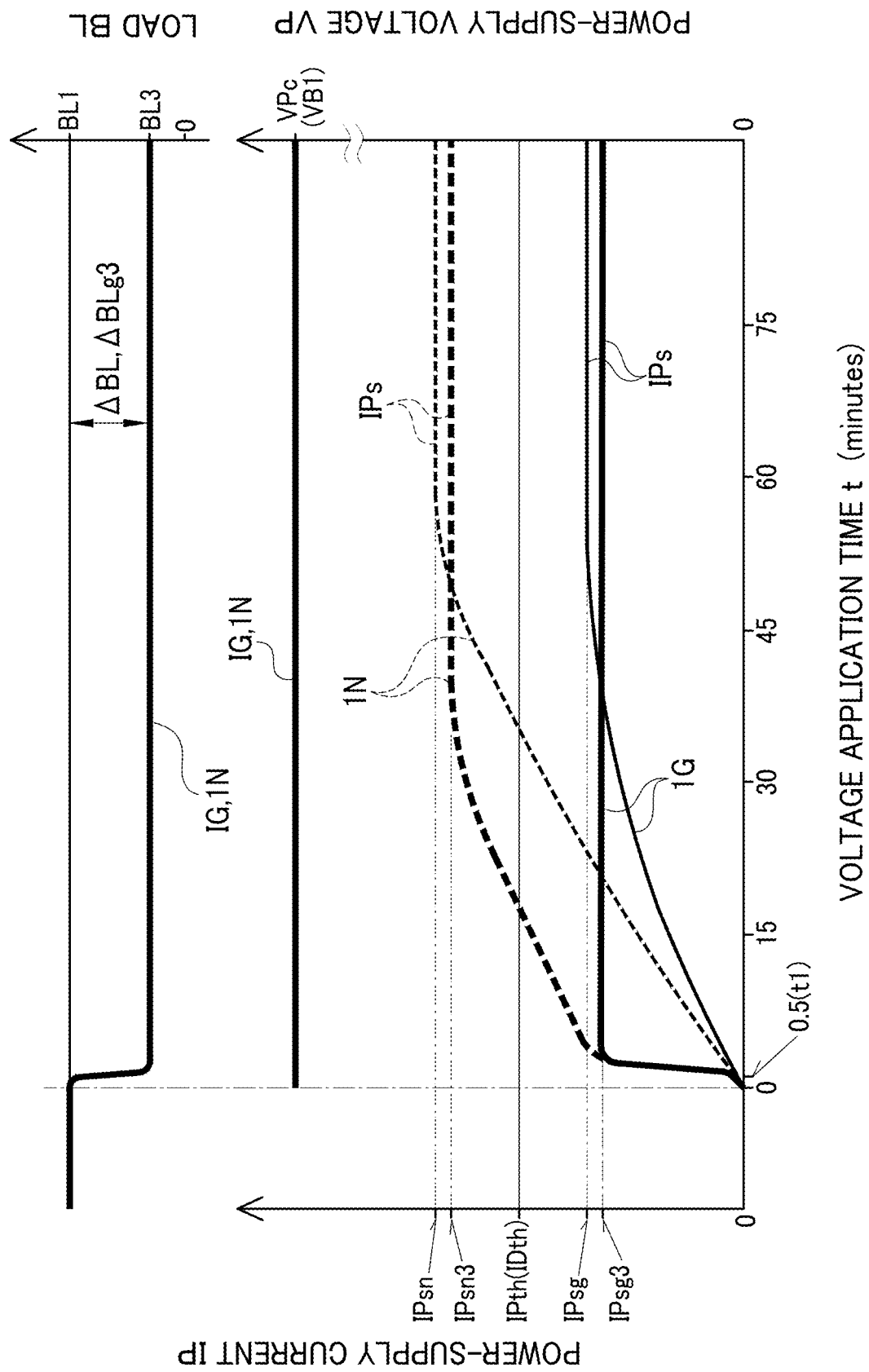
FIG. 6 is a graph schematically showing temporal changes in power-supply voltage, load, and power-supply current, with respect to a voltage application time in each of non-defective batteries and defective batteries in the first modified embodiment and the reference embodiment.

In the first embodiment, therefore, the load reduction step S12 is carried out immediately after the start of the voltage continuous application step S8, concretely, at the first time t1 (t1≤30 minutes) (see FIGS. 2 and 6).

This first modified embodiment is similar to the foregoing first embodiment excepting only the timing of performing the load reduction step S12. Thus, the following description is made with a focus on differences from the first embodiment and the details of similar or identical parts to those in the first embodiment will be omitted or simplified.

The battery 1 (see FIG. 1) in the first modified embodiment is identical in structure to the battery 1 used in the first embodiment and others and the details thereof will be omitted. In the production method for the battery 1 (see FIG. 2), the assembly step S1 to the determination step S11 are also the same as those in the first embodiment and thus their details are omitted.

In the first modified embodiment, as described above, the first time t1 is set to 30 seconds (t1=30 sec.). Further, the load reduction amount ΔBL is assumed as a non-defective-product load reduction amount ΔBLg3 different from that in the first embodiment.

This non-defective-product load reduction amount ΔBLg3 is obtained as below as in the first embodiment in which the non-defective-product load reduction amount ΔBLg2. Specifically, for the non-defective batteries 1G, at the time when the first time t1 (=30 seconds) elapses from the start of the voltage continuous application step S8, the load BL is reduced from the first load BL1 by the load reduction amount ΔBL, which is variously set different in magnitude between the batteries 1G. From among these various load reduction amounts ΔBL, one load reduction amount ΔBL having such a magnitude as to cause the power-supply current IP to stabilize most quickly after reduction of the load BL is obtained as the non-defective-product load reduction amount ΔBLg3. This non-defective-product load reduction amount ΔBLg3 is larger than the non-defective-product load reduction amount ΔBLg2 used in the first embodiment (ΔBLg3>ΔBLg2). This is because, in the first modified embodiment, the increment of the power-supply current IP is smaller and the decrease of the battery component voltage VBB is smaller than in the first embodiment in which the load reduction step S12 is performed after a lapse of 5.0 minutes from the start of the voltage continuous application step S8. Thus, the battery component voltage VBB in this first modified embodiment has to be reduced more greatly by reduction of the load BL.

In the first modified embodiment, as indicated by a thick solid line in a middle part in FIG. 6, the continuous power-supply voltage VPc is continuously applied after the start of the voltage continuous application step S8 (the voltage application time t=0). Further, as indicated by a thick solid line in an upper graph in FIG. 6, the load BL of the battery 1 is reduced rapidly (within 1 minute, e.g., within 10 seconds, as in the first embodiment) from the first load BL1 to the third load BL3 by the aforesaid non-defective-product load reduction amount ΔBLg3 (=BL1−BL3) at the time when the first time t1=30 seconds in the first modified embodiment) elapses.

The following description is given to how the power-supply current value IP(n) of the power-supply current IP flowing from the external power supply EP to the battery 1 changes in the above case, referring to a lower graph in FIG. 6.

Herein, when the battery 1 under inspection is a non-defective battery 1G, as indicated by a thick solid line in the lower graph in FIG. 6, immediately after the start of the voltage continuous application step S8, to be exact, from after a lapse of the first time t1 set to 30 seconds, the power-supply current IP sharply increases due to the decrease of the battery component voltage VBB caused by reduction of the load BL applied to the battery 1 by the non-defective-product load reduction amount ΔBLg3. When the load BL is reduced to the third load BL3, the power-supply current IP quickly converges to the stabilized power-supply current value IPsg3 of the non-defective battery 1G under a new load (the third load BL3) and then remains at this stabilized power-supply current value IPsg3. Herein, as can be easily understood by comparison with the reference embodiment indicated by the thin solid line, it is revealed from comparison of the non-defective batteries 1G between the first modified embodiment and the reference embodiment that the method of the first modified embodiment can more greatly shorten the time required for the power-supply current IP to stabilize than the reference embodiment (and also than the first embodiment (see FIG. 5)).

Moreover, when the battery 1 under inspection is a defective battery 1N, similarly, as indicated by a thick broken line in the lower graph in FIG. 6, immediately after the start of the voltage continuous application step S8, the power-supply current IP sharply increases due to the decrease of the battery component voltage VBB caused by reduction of the load BL applied to the battery 1 by the non-defective-product load reduction amount ΔBLg3. However, differently from the aforementioned case of the non-defective batteries 1G, the power-supply current IP in the defective battery 1N, gradually increases after the load BL becomes the third load BL3. In other words, the power-supply current IP gradually increases toward a stabilized power-supply current value IPsn3 of the defective battery 1N under the new load (the third load BL3) and then reaches and stabilizes at this stabilized power-supply current value IPsn3. Herein, as can be easily understood by comparison with the reference embodiment indicated by the thin broken line, it is revealed from comparison of the defective batteries 1N between the first modified embodiment and the reference embodiment that the first modified embodiment can also more greatly shorten the time required for the power-supply current IP to stabilize than the reference embodiment (and also than the first embodiment (see FIG. 5)).

In the first modified embodiment, consequently, regardless whether the battery 1 is a non-defective battery 1G or a defective battery 1N, the self-discharge state of the battery 1 can be more early determined in the determination step S11 as compared with the reference embodiment and further the first embodiment (see FIG. 5).

Second Embodiment

In the foregoing first embodiment and first modified embodiment (see FIGS. 1 to 6), the load reduction step S12 is configured to reduce the load BL applied to the battery 1 from the first load BL1 by the load reduction amount ΔBL set to the non-defective-product load reduction amount ΔBLg2 or ΔBLg3 obtained for a non-defective battery 1G.

In contrast, the second embodiment (see FIGS. 1 to 4 and 7) differs from the above first embodiment and first modified embodiment in that the load reduction step S12 is configured to reduce the load BL applied to the battery 1 from the first load BL1 by a threshold load reduction amount ΔBLth obtained as the load reduction amount ΔBL for the threshold battery 1TH. A second time t2 is set to 30 seconds as with the first time t1 in the first modified embodiment. Thus, the following description is focused on differences from the above embodiments, and the details of similar or identical parts will be omitted or simplified.

The battery 1 used in the second embodiment is identical in structure to the battery 1 used in the first embodiment and others and thus the details thereof are omitted herein. Further, the assembly step S1 to the determination step S11 in the production method for the battery 1 (see FIG. 2) are the same as those in the first embodiment and accordingly their details are also omitted.

In the second embodiment, as described above, the second time t2 is set to 30 seconds. The load reduction amount ΔBL is assumed as a threshold load reduction amount ΔBLth different from that in the first embodiment and others.

This threshold load reduction amount ΔBLth is determined as below. For the battery 1TH in which a magnitude of the self-discharge current ID is equal to the threshold current value IPth under the first load BL1, the load BL is reduced from the first load BL1 by the load reduction amount ΔBL, which is variously set different in magnitude between the batteries 1TH, at the time when the second time t2 (=30 seconds) elapses from the start of the voltage continuous application step S8. Then, the load reduction amount ΔBL having such a magnitude as to cause the power-supply current IP to stabilize most quickly after reduction of the load BL is obtained as the threshold load reduction amount ΔBLth. This threshold load reduction amount ΔBLth is larger than the non-defective-product load reduction amount ΔBLg2 used in the first embodiment and the non-defective-product load reduction amount ΔBLg3 used in the first modified embodiment: ΔBLth>ΔBLg3>ΔBLg2. This is because, as can be easily understood from FIG. 7, the battery component voltage VBB has to be reduced more greatly by reduction of the load BL in performing the load reduction step S12.

Figure 7:
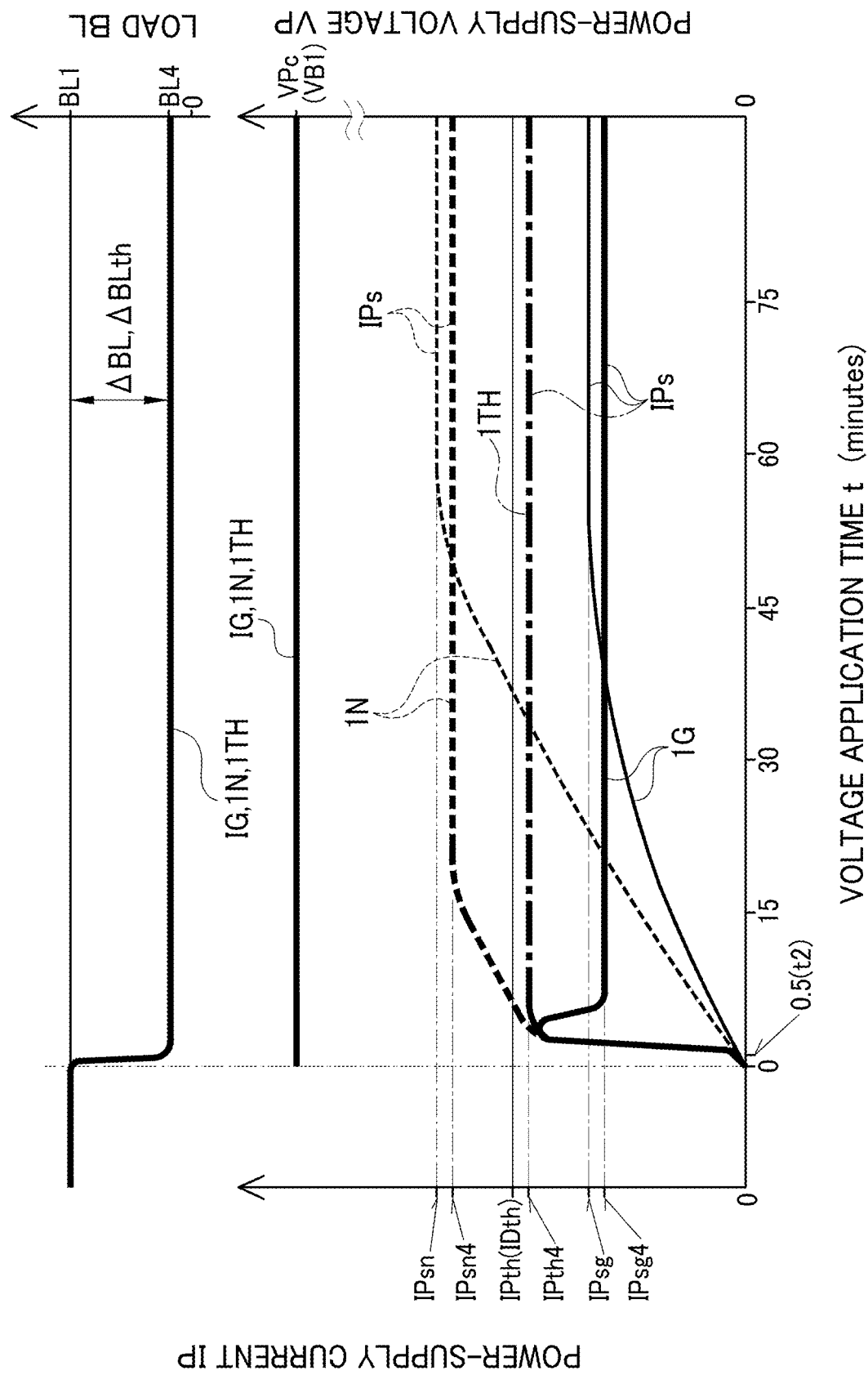
FIG. 7 is a graph schematically showing temporal changes in power-supply voltage, load, and power-supply current, with respect to a voltage application time in each of non-defective batteries, defective batteries, and threshold batteries in the second embodiment and the reference embodiment.

In the second embodiment, as in the foregoing first modified embodiment, the continuous power-supply voltage VPc is continuously applied after the start of the voltage continuous application step S8 (the voltage application time t=0) as indicated by a thick solid line in a middle part in FIG. 7. Further, as indicated by a thick solid line in an upper graph in FIG. 7, the load BL of the battery 1 is reduced rapidly (within 1 minute, e.g., within 10 seconds, also in the second embodiment) from the first load BL1 to a fourth load BL4 by the foregoing threshold load reduction amount ΔBLth (=BL1−BL4) at the time when the second time t2 (=30 seconds) elapses.

The following description is given to how the power-supply current value IP(n) of the power-supply current IP flowing from the external power supply EP to the battery 1 changes, referring to a lower graph in FIG. 7.

Herein, when the battery 1 under inspection is a threshold battery 1TH, as indicated by a thick chain line in a lower graph in FIG. 7, the power-supply current IP sharply increases due to the decrease of the battery component voltage VBB caused by reduction of the load BL applied to the battery 1 by the threshold load reduction amount ΔBLth immediately after the start of the voltage continuous application step S8, to be exact, after a lapse of the second time t2 (=30 seconds). When the load BL is reduced to the fourth BL4, the power-supply current IP rapidly converges to a stabilized power-supply current value IPsth4 of the threshold battery 1TH under a new load (the fourth load BL4) and then remains at this stabilized power-supply current value IPsth4. This behavior serves as a criterion for determination of the quality of the battery 1.

Similarly, when the battery 1 to be inspected is a defective battery 1N, as indicated by a thick broken line in the lower graph in FIG. 7, the power-supply current IP sharply increases due to the decrease of the battery component voltage VBB caused by reduction of the load BL applied to the battery 1 by the threshold load reduction amount ΔBLth immediately after the start of the voltage continuous application step S8. However, differently from the foregoing threshold battery 1TH, the power-supply current IP gradually increases after the load BL becomes the fourth load BL4. Specifically, the power-supply current IP gradually increases toward a stabilized power-supply current value IPsn4 under a new load (the fourth load BL4) and then reaches and stabilizes at this stabilized power-supply current value IPsn4. Herein, as can be easily understood by comparison with the reference embodiment indicated by the thin broken line, it is revealed from comparison of the defective batteries 1N between the second embodiment and the reference embodiment that the second embodiment can more greatly shorten the time required for the power-supply current IP to stabilize than the reference embodiment (and also than the first embodiment (see FIG. 5)).

In contrast, even when the battery 1 to be inspected is a non-defective battery 1G, as indicated by a thick solid line in the lower graph in FIG. 7, the power-supply current IP sharply increases due to the decrease of the battery component voltage VBB immediately after the start of the voltage continuous application step S8, as with the threshold battery 1TH. However, when the load BL is then reduced to the fourth load BL4, the power-supply current IP rapidly decreases toward a stabilized power-supply current value IPsg4 under a new load (the fourth load BL4) and then stabilizes thereat. Herein, as can be easily understood by comparison with the reference embodiment indicated by the thin solid line, it is revealed from comparison between the non-defective batteries 1G that the second embodiment can more greatly shorten the time required for the power-supply current IP to stabilize than the reference embodiment (and also than the first embodiment (see FIG. 5)).

In the second embodiment, as in the first modified embodiment, the self-discharge state of the battery 1 can be determined in the determination step S11 by use of the power-supply current value IP(n) obtained after the start (t=0) of the voltage continuous application step S8. According to the second embodiment, consequently, the quality of the battery 1 can be very early determined as compared with the conventional art.

The determination step S11 in the second embodiment may be configured differently from the foregoing embodiments. For example, in the determination step S11, the power-supply current value IP(n) may be used to determine that a battery 1 having a negative inclination of change in the power-supply current value IP(n) during the voltage application time t set to a predetermined period (e.g., t=6 to 7 minutes) is a non-defective battery 1G. In contrast, other batteries 1 not determined to be non-defective batteries 1G may be determined to be defective batteries 1N. In this case, the quality of each battery 1 can be very early determined as compared with the first embodiment.

The inspection method of the second embodiment can also provide an improved new inspection method based on the initial battery voltage measurement step S7 to the determination step S11 and the load reduction step S12. Further, in the production method for the battery 1 in the second embodiment, the inspection process including the initial battery voltage measurement step S7 to the determination step S11 and the load reduction step S12 is performed after the initial charge step S3. Therefore, the battery 1 can be produced through the inspection about the presence/absence and the degree of a short-circuit in the initial stage of the battery 1 with such an improved new inspection manner.

In the inspection method of the second embodiment, after a lapse of the first time from the start of the voltage continuous application step, the load BL applied to the inspected battery 1 is reduced by the threshold load reduction amount ΔBLth. Thus, the behavior of the power-supply current IP depends on whether the battery 1 is a non-defective battery 1G or a defective battery 1N. It is therefore possible to easily determine whether the battery 1 under inspection is a non-defective battery 1G or a defective battery 1N by detecting whether the power-supply current IP has decreased or increased from the threshold current value IPth or alternatively the power-supply current IP tends to decrease of tends to increase, after the load reduction step S12 (t=t2 and subsequent) even without waiting the stabilization of the power-supply current IP. Consequently, more quick determination can be achieved.

The present disclosure is described as above in the first and second embodiments and the first modified embodiment, but is not limited thereto. The present disclosure may be embodied in other specific forms without departing from the essential characteristics thereof.

For instance, in the first and second embodiments and the first modified embodiment, in the process of producing the battery 1, the inspection process of the self-discharge inspection of the battery 1 is performed as shown in the initial battery voltage measurement step S7 to the load reduction step S12. As an alternative, the inspection process may be applied to the self-discharge inspection of a used battery 1 that has been placed on the market and already used.

In the first and second embodiments and the first modified embodiment, the quality of the battery 1 is determined by use of the threshold current value IPth. As an alternative, a plurality of different threshold current values may be used to classify the battery 1 into three or more ranks.

The first embodiment exemplifies that the first time t1 is set to 5.0 minutes. However, in FIG. 5, when the non-defective battery 1G is subjected to the voltage continuous application step S8 without undergoing the load reduction step S12, which corresponds to the reference embodiment indicated by the thin solid line in the lower graph in FIG. 5, it takes about 55 minutes for the power-supply current IP to stabilize, that is, the stabilization achieving time is about 55 minutes. Accordingly, when the first time t1 is set to half of the stabilization achieving time in the reference embodiment, that is, to 27 minutes or less, a certain level of the effect of reducing the stabilization achieving time can be achieved.

Reference Signs List 1 (Charged) Battery (Power storage device)
S2 Load application step
KJ Restraining jig
S3 Initial charge step
S6 Leaving step
S7 Initial battery voltage measurement step (Voltage detection step, Inspection step)
S8 Voltage continuous application step (Inspection step)
S9 Current detection step (Inspection step)
S10 Continuation judgement step (Inspection step)
t Voltage application time
t1 First time
t2 Second time
S11 Determination step (Inspection step)
S12 Load reduction step (Inspection step)
BL Load (applied to battery)
BL1 First load
BL2 Second load
BL3 Third load
BL4 Fourth load
ΔBL Load reduction amount
ΔBLg2, ΔBLg3 Load reduction amount for non-defective product
ΔBLth Threshold load reduction amount
TB Battery temperature (Device temperature)
TB1 First battery temperature (First device temperature)
VB Battery voltage (Device voltage)
VB1 First battery voltage (First device voltage)
EP External power supply
VP Power-supply voltage (of external power supply)
VPc Continuous power-supply voltage IP Power-supply current
IP0 Initial current value
IP(n) (Obtained) Power-supply current value
IPs Stabilized power-supply current
IPth Threshold current value (of power-supply current)
1B Battery component
VBB Battery component voltage (generated in battery component)
Rs DC resistance (of battery)
Rp Short-circuit resistance (of battery)
ID Self-discharge current
IDth Threshold current value (of self-discharge current)

What is claimed is:

1. A method for inspecting self-discharge of a power storage device, wherein the power storage device has a property that while the power storage device is pressed under a load set to a first load and charged with a device voltage set to a first device voltage, when the load is reduced from the first load, the device voltage decreases below the first device voltage,
wherein the method comprises:
a) detecting the first device voltage of the power storage device pressed under the first load and charged with the first device voltage;
b) continuously applying a power-supply voltage equal in magnitude to the first device voltage from an external power supply to the power storage device;
c) detecting a power-supply current flowing from the external power supply to the power storage device;
d) determining a self-discharge state of the power storage device based on the detected power-supply current; and
after start of the continuously applying b), before the power-supply current stabilizes, e) reducing the load applied to the power storage device from the first load by a load reduction amount.

2. The method for inspecting self-discharge of a power storage device according to claim 1, wherein
the reducing e) is configured to: f) reduce the load applied to the power storage device after a lapse of a predetermined first time from the start of the continuously applying b), and
the load reduction amount is a non-defective-product load reduction amount meeting the following conditions:
(i) the power storage device is a non-defective device having a self-discharge current that is lower than a threshold current value; and
(ii) when the load applied to the non-defective device is reduced from the first load by the load reduction amount after a lapse of the predetermined first time from the start of the continuous applying b), the power-supply current increases due to a decrease of the device voltage caused by the load reduction, and then stabilizes at a stabilized power-supply current of the non-defective device, which is smaller than the threshold current value.

3. The method for inspecting self-discharge of a power storage device according to claim 1, wherein
the reducing e) is configured to: g) reduce the load applied to the power storage device after a lapse of a predetermined second time from start of the continuously applying b),
the load reduction amount is a threshold load reduction amount meeting the following conditions:
(iii) the power storage device is a threshold device having a self-discharge current corresponding to a magnitude of a threshold current value; and
(vi) when the load applied to the threshold device is reduced from the first load by the load reduction amount after a lapse of the predetermined second time from the start of the continuously applying b), the power-supply current increases due to a decrease of the device voltage caused by the load reduction, and then stabilizes at the threshold current value.

4. A method for producing a power storage device, the method comprising:
h) initially charging an assembled and uncharged power storage device into a predetermined charge state to provide a previously-charged power storage device; and
i) inspecting a self-discharge state of the initially charged power storage device by the self-discharge inspection method for the power storage device according to claim 1.

5. A method for producing a power storage device, the method comprising:
h) initially charging an assembled and uncharged power storage device into a predetermined charge state to provide a previously-charged power storage device; and
i) inspecting a self-discharge state of the initially charged power storage device by the self-discharge inspection method for the power storage device according to claim 2.

6. A method for producing a power storage device, the method comprising:
h) initially charging an assembled and uncharged power storage device into a predetermined charge state to provide a previously-charged power storage device; and
i) inspecting a self-discharge state of the initially charged power storage device by the self-discharge inspection method for the power storage device according to claim 3.

* * * * *